United States Patent
Minamio et al.

(10) Patent No.: US 7,495,339 B2
(45) Date of Patent: Feb. 24, 2009

(54) CONNECTION STRUCTURE AND METHOD FOR FABRICATING THE SAME

(75) Inventors: Masanori Minamio, Osaka (JP); Hiroaki Fujimoto, Osaka (JP); Atsuhito Mizutani, Kyoto (JP); Hisaki Fujitani, Kyoto (JP); Toshiyuki Fukuda, Kyoto (JP)

(73) Assignee: Panasonic Corporation, Osaka (JP)

( * ) Notice: Subject to any disclaimer, the term of this patent is extended or adjusted under 35 U.S.C. 154(b) by 15 days.

(21) Appl. No.: 11/544,633

(22) Filed: Oct. 10, 2006

(65) Prior Publication Data

US 2007/0187834 A1    Aug. 16, 2007

(30) Foreign Application Priority Data

Feb. 15, 2006    (JP)    ............................. 2006-038443

(51) Int. Cl.
*H01L 23/52* (2006.01)

(52) U.S. Cl. .................................................. 257/765

(58) Field of Classification Search .................. 257/765; 438/455

See application file for complete search history.

(56) References Cited

U.S. PATENT DOCUMENTS 4,564,734 A * 1/1986 Okikawa ................. 219/56.22
6,858,943 B1 * 2/2005 Peterson et al. ............. 257/784

FOREIGN PATENT DOCUMENTS

JP    2002-27595    1/2002
JP    2005-193336   7/2005

* cited by examiner

*Primary Examiner*—Thao X Le
*Assistant Examiner*—Kimberly Trice
(74) *Attorney, Agent, or Firm*—McDermott Will & Emery LLP

(57) ABSTRACT

There is provided a connection structure between a Si electrode (Si member) and an Al wire (Al member). Between the Si electrode and the Al wire, a first part and second parts are present in interposed relation. Each of the first and second parts is in contact with the Si electrode and with the Al wire. In the first part, a Si oxide layer and an Al oxide layer are present. The Si oxide layer is in contact with the Si electrode. The Al oxide layer is interposed between the Si oxide layer and the Al wire. In some of the second parts, Al is present. In the others of the second parts, a Si portion and an Al portion are present.

6 Claims, 8 Drawing Sheets

CONNECTION STRUCTURE AND METHOD FOR FABRICATING THE SAME

CROSS-REFERENCE TO RELATED APPLICATIONS

The teachings of Japanese Patent Application JP 2006-038443, filed Feb. 15, 2006, are entirely incorporated herein by reference, inclusive of the claims, specification, and drawings.

BACKGROUND OF THE INVENTION

The present invention relates to a connection structure and a method for fabricating the same and, more particularly, to a connection structure between a Si member and an Al member and to a method for fabricating the same.

In recent years, Micro-Electro-Mechanics (MEMS) has received attention as a technology for fabricating a minute and high-precision device and has been vigorously studied. The main stream of the MEMS technology is a fusion of multiple types of technologies such as semiconductor processing, machining, and electric circuit engineering, as shown in Japanese Laid-Open Patent Publication No. 2005-193336. The major characteristic feature of the main-stream technology is that the structure of a device is formed and embedded in a silicon wafer by etching.

By thus forming and embedding the structure of a device in a silicon wafer, an electronic circuit for driving and controlling the device can also be formed integrally on the same silicon wafer. Therefore, the main-stream technology is also advantageous in terms of device miniaturization and has been used for, e.g., the microphone of a mobile telephone or the like (see Japanese Laid-Open Patent Publication No. 2002-27595).

However, since the MEMS technology forms and embeds the structure of a device in a silicon wafer by etching, not only silicon but also aluminum, copper and the like which form wirings for the semiconductor device are also removed undesirably. It follows that, at the time at which the device structure is completed, silicon or silicon dioxide occupies the electrode portions of the device. To introduce external power into the device or input and output electric signals to and from the device, it is necessary to connect the device to an external circuit by some method. However, to perform wire bonding using gold wires, which is a simplest and most reliable connection method, a metal layer of Au, Al, or the like need to be formed in each of the electrode portions of the device by plating or the like. The formation of such a metal layer leads to a significant cost increase and causes the problem of a high-priced device.

SUMMARY OF THE INVENTION

The present invention provides a connection structure which allows reliable connection between Si and Al at low cost and a method for fabricating the same.

Specifically, a first connection structure according to the present invention is a connection structure between a Si member made of Si and an Al member made of Al, the connection structure comprising: a first part and a second part each interposed between the Si member and the Al member in contact relation with each of the Si member and the Al member. A Si oxide layer and an Al oxide layer are present in the first part. The Si oxide layer is in contact with the Si member and the Al oxide layer is interposed between the Si oxide layer and the Al member. At least one of Si and Al is present in the second part.

A second connection structure according to the present invention is a connection structure between a Si member made of Si and an Al member made of Al. An interposed layer composed of a Si oxide layer and an Al oxide layer is present between the Si member and the Al member. The Si member, the Si oxide layer, the Al oxide layer, and the Al member are stacked in this order. The interposed layer has a penetrating portion which extends from the Al member through the interposed layer to reach the Si member and the penetrating portion is made of at least one of Al and Si.

In the arrangement, the Al member is connected to the Si member without the interposition of plating of Au or the like.

A method for fabricating a connection structure according to the present invention is a method for fabricating a connection structure between a Si member and an Al member. Specifically, the method comprises: a bonding step of pressing the Al member against the Si member by using a solderless vibrating member and applying an ultrasonic wave to the solderless vibrating member to bond the Al member to the Si member; and a voltage applying step of applying a voltage between the Si member and the Al member bonded thereto. The bonding step includes forming an interposed layer composed of an Al oxide layer and a Si oxide layer between the Al member and the Si member and the voltage applying step includes partially removing the interposed layer to bring the Al member and the Si member into contact with each other.

Such a fabrication method provides connection between the Si member and the Al member via an interposed layer in the bonding step and brings a part of the Al member into contact with a part of the Si member in the voltage application step. As a result, it is possible to provide connection between the Si member and the Al member without using plating of Au or the like and fabricate a connection structure.

DESCRIPTION OF THE PREFERRED EMBODIMENTS

Figure 1:
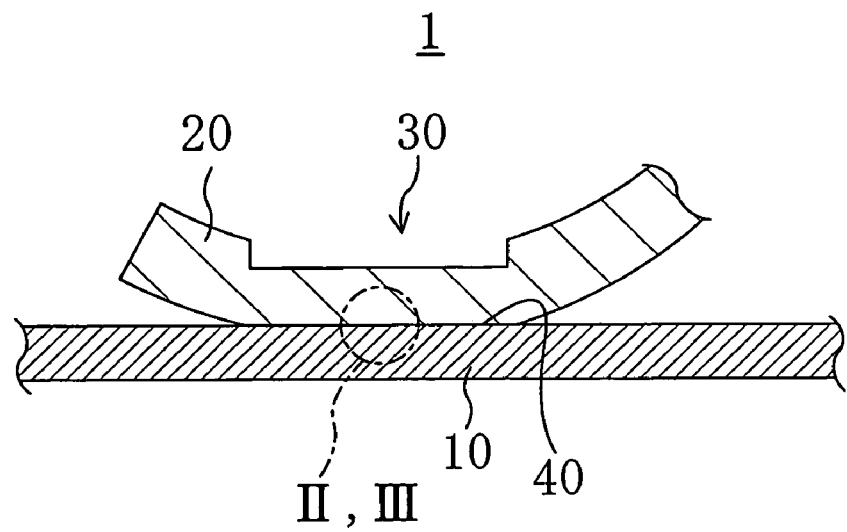
FIG. 1 is a cross-sectional view schematically showing a connection structure 1.

Referring to the drawings, the embodiments of the present invention will be described herein below in detail. It is to be noted that the present invention is not limited to the following embodiments.

Embodiment 1

The first embodiment of the present invention will describe a connection structure between an Si electrode and an Al wire and a method for fabricating the same by using the Si electrode as an example of a Si member and using the Al wire as an example of an Al member.

Figure 2:
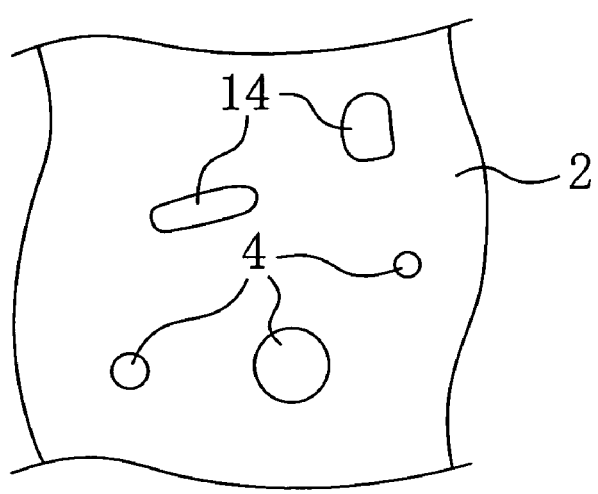
FIG. 2 is an enlarged plan view of the area enclosed by the broken circle shown in FIG. 1.
Figure 3A:
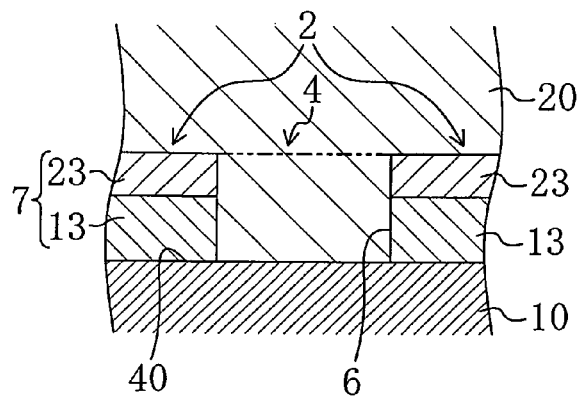
FIG. 3A is an enlarged cross-sectional view showing the structure of a second part of the connection structure according to a first embodiment of the present invention and FIG. 3B is an enlarged cross-sectional view showing the structure of another second part of the connection structure according to the first embodiment.
Figure 3B:
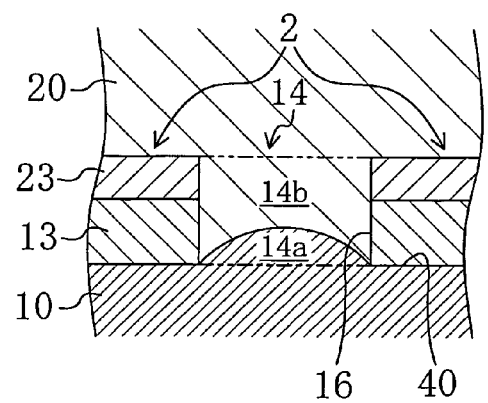

FIGS. 1 to 3B are views each schematically showing a connection structure 1 according to the present embodiment, of which FIG. 1 is a cross-sectional view schematically showing the connection structure 1, FIG. 2 is an enlarged plan view of the area enclosed by the broken circle of FIG. 1, FIG. 3A is an enlarged cross-sectional view of the area enclosed by the broken circle of FIG. 1 at one location, and FIG. 3B is an enlarged cross-sectional view of the area enclosed by the broken circle of FIG. 1 at another location.

As shown in FIG. 1, the connection structure 1 according to the present embodiment has a connection portion 30 in which an Al wire 20 is connected to a Si electrode 40. In the connection portion 30, a first part 2, a plurality of second parts 4, and a plurality of second parts 14 are interposed between the Si electrode 40 and the Al wire 20, as shown in FIG. 2. Each of the first part 2, the plurality of second parts 4, and the plurality of second parts 14 is in contact with the Si electrode 40 and also with the Al wires 20. In the first part 2, a Si oxide layer 13 and an Al oxide layer 23 are present, as shown in FIGS. 3A and 3B. The Si oxide layer 13 is in contact with the Si electrode 40, while the Al oxide layer 23 is interposed between the Si oxide layer 13 and the Al wire 20. In each of the second parts 4, Al is present in such a manner that it extends from the Al wire 20 toward the Si electrode 40 and comes in contact therewith, as shown in FIG. 3A. In each of the second parts 14, a Si portion 14a and an Al portion 14b are present in such a manner that the Si portion 14a extends from the Si electrode 40 toward the Al wire 20 and the Al portion 14b extends from the Al wire 20 toward the Si electrode 40 and comes in contact with the Si portion 14a, as shown in FIG. 3B. Thus, in the first part 2, the Al wire 20 is connected to the Si electrode 40 with the Si oxide layer 13 and the Al oxide layer 23 interposed therebetween. In each of the second parts 4 and 14, the Al wire 20 is in contact with the Si electrode 40. This allows the Al wire 20 to be connected to the Si electrode 40 without the interposition of plating of Au or the like in the connection structure 1 according to the present embodiment.

In other words, the connection structure 1 according to the present embodiment is constructed such that, in the connection portion 30, an interposed layer 7 composed of the Si oxide layer 13 and the Al oxide layer 23 is present between the Si electrode 40 and the Al wire 20. The interposed layer 7 is provided with a plurality of penetrating portions 6 each of which extends from the Al wire 20 through the interposed layer 7 to reach the Si electrode 40. In several ones of the plurality of penetrating portions 6, Al is present in such a manner that it extends from the Al wire 20 toward the Si electrode 40 and comes in contact therewith, as shown in FIG. 3A. In the other penetrating portions 6, the Si portions 14a and the Al portions 14b are present in such a manner that the Si portions 14a extend from the Si electrode 40 toward the Al wire 20 and the Al portions 14b extend from the Al wire 20 toward the Si electrode 40 and come in contact with the Si portions 14a, as shown in FIG. 3B.

The Si electrode 40 is made of polycrystalline silicon with an excellent electric property and provided on the surface of the Si substrate 10. The Al wire 20 contains Si at a ratio of 1%. Since the Al wire 20 thus contains Si, the mechanical property of the Al wire 20 can be improved (specifically, the bending strength of the Al wire 20 can be enhanced) and the Al wire 20 can be securely connected to the Si electrode 40.

A detailed description will be given herein below to the second parts 4 and 14 according to the present embodiment.

The present inventors have found that the first part can be formed by pressing the Al wire against the Si electrode using a solderless vibrating member (e.g., wedge tool) and applying an ultrasonic wave to the solderless vibrating member. Before giving the detailed description to the second parts 4 and 14, the first part 2 will be shown. In the following description, the state of the Al wire 20 in the first part 2 will be described as "the Al wire 20 is bonded to the Si electrode 40".

Figure 4A:
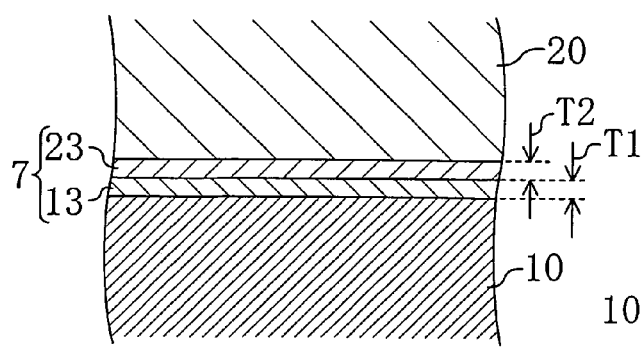
FIG. 4A is an enlarged cross-sectional view of a first part and FIG. 4B is an enlarged cross-sectional view of the portion of a Si electrode to which an Al wire has not been bonded.

FIG. 4A is an enlarged cross-sectional view of the first part 2. In the first part 2, the Si oxide layer 13 is in contact with the Si electrode 40, as stated previously, is made of, e.g., $SiO_2$, and extends to have a substantially uniform thickness T1. The Al oxide layer 23 is interposed between the Si oxide layer 13 and the Al wire 20, as stated previously, is made of, e.g., $Al_2O_3$, and extends to have a substantially uniform thickness T2. The thickness (T1+T2) of the interposed layer 7 is preferably not less than 0.1 nm and not more than 10 nm. When the thickness of the interposed layer 7 is less than 0.1 nm, the Al wire 20 cannot be securely connected to the Si electrode 40 so that the Al wire 20 is likely to be disconnected from the Si electrode 40 undesirably. Conversely, when the thickness of the interposed layer 7 exceeds 10 nm, the electric resistance between the Al wire 20 and the Si electrode 40 is increased so that it becomes difficult to provide an electrical connection between the Al wire 20 and the Si electrode 40. For example, when the substantially uniform thickness T1 is within a tolerance of ±10% relative to 0.6 nm and when the substantially uniform thickness T2 is within a tolerance of ±10% relative to 0.4 nm, the thickness (T1+T2) of the interposed layer 7 desirably falls within a tolerance of, e.g., ±10% relative to 1.0 nm.

Figure 4B:
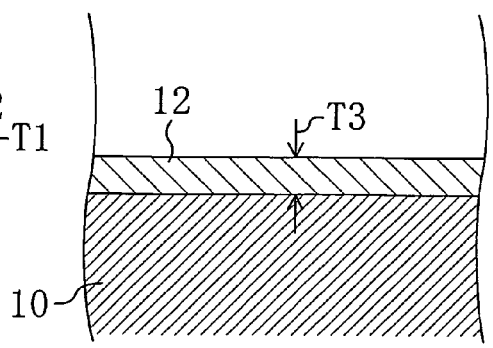

FIG. 4B is a cross-sectional view of the portion of the Si electrode 40 to which the Al wire 20 is not bonded. As shown in FIG. 4B, a Si natural oxide film 12 is present on the surface of the portion of the Si electrode 40 to which the Al wire 20 is not bonded. The thickness T3 of the natural oxide film 12 is about 1 nm and larger than the thickness T1 of the Si oxide layer 13. The reason for the Si oxide layer 13 thinner than the natural oxide film 12 is that, at the time at which the Al wire 20 is pressed onto the Si natural oxide film 12 with the application of an ultrasonic wave and a load thereto, the Si natural oxide film 12 is destroyed and a newly formed Si surface emerges so that a new Si oxide layer 13 is formed at the interface with the Al wire 20.

Figure 5:
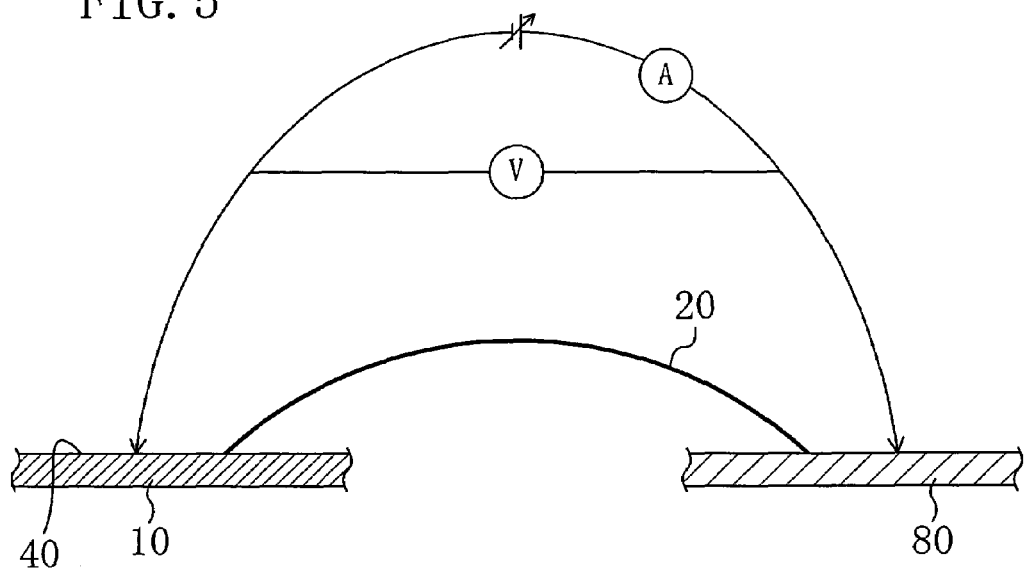
FIG. 5 is a view schematically showing an embodiment of a system for applying a voltage between the Si electrode and the Al wire bonded thereto.
Figure 6:
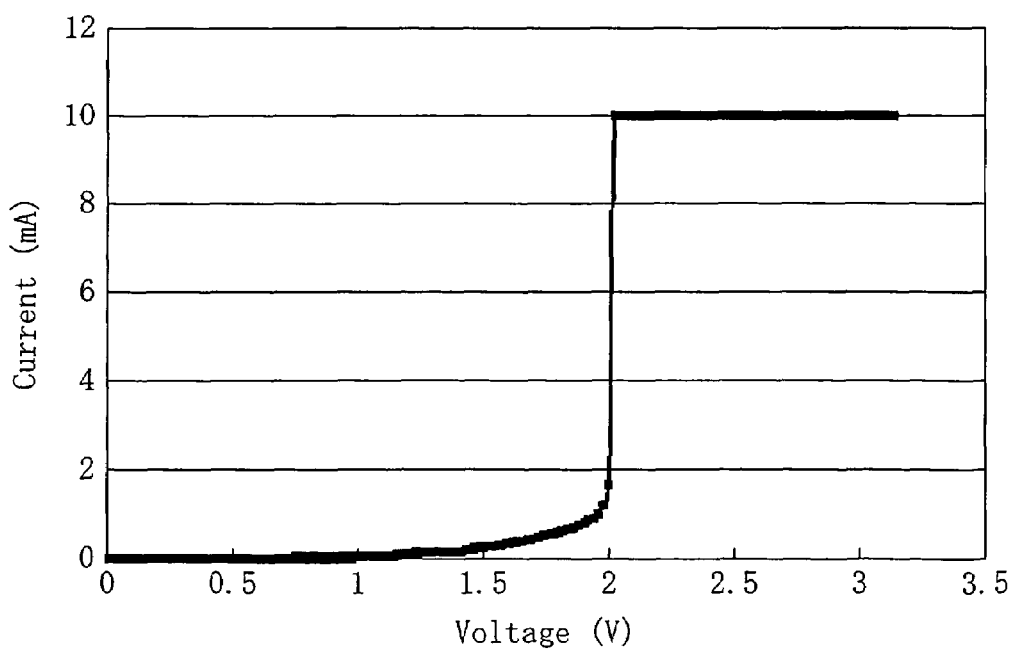
FIG. 6 is a graph showing the result of examining an I-V characteristic.

The present inventors have newly found that, by applying a voltage after bonding the Al wire to the Si electrode, the first part is partially removed and the second parts are formed. To apply a voltage after bonding, the following two methods were practiced. FIG. 5 is a schematic view of a voltage application system used in the first application method. In the first application method, one Si electrode 40, another electrode 80 other than the Si electrode 40, and one Al wire 20 were prepared. Next, as shown in FIG. 5, one end of the Al wire 20 was bonded to the Si electrode 40 and the other end of the Al wire 20 was electrically connected to the other electrode 80. Then, the I-V characteristic was examined by applying a voltage between the Si electrode 40 and the other electrode 80. FIG. 6 is a graph showing the result of examining the I-V characteristic obtained in accordance with the application method. As shown in FIG. 6, although a high electric resistance was present between the Al member 20 and the Si electrode 40 when a voltage of less than 2 V was applied, an electrical connection could be provided between the Al member 20 and the Si electrode 40 by applying a voltage of 2 V.

In the second application method (not shown), one Si electrode, two electrodes other than the Si electrode, and two Al wires were prepared. Next, one end of one of the two Al wires was bonded to one of the other two electrodes and one end of the other Al wire was electrically connected to the other of the other two electrodes. At the same time, the respective other ends of the two Al wires were connected to the Si electrode. Then, a voltage was applied between the other two electrodes. As a result, a high electric resistance was present between the Al member and the Si electrode when a voltage of less than 0.8 V was applied, though it is not depicted. However, an electrical connection could be provided between the Al member and the Si electrode when a voltage of 0.8 V was applied.

It has generally been known that, when a semiconductor and a metal are brought closer to each other, a junction barrier such as a Schottky barrier is formed between the semiconductor and the metal. When a junction barrier is formed, a rectifying effect is obtained so that an ohmic contact is not formed between the semiconductor and the metal merely by increasing the value of an applied voltage. However, as shown in FIG. 6 and in the result of practicing the second application method, an ohmic contact could be formed successfully between the Si electrode 40 and the Al wire 20 by bonding the Al wire 20 to the Si electrode 40 and then applying a voltage having a specified value or more between the Si electrode 40 and the Al wire 20. From this, the present inventors assumed that a junction barrier was not formed between the Si electrode 40 and the Al wire 20 when the Al wire 20 is bonded to the Si electrode 40 and had the following thoughts on the result of examining the I-V characteristic shown in FIG. 6 and on the result of examining the I-V characteristic in accordance with the second application method.

When the Al wire 20 is bonded to the Si electrode 40, the interposed layer 7 is formed between the Si electrode 40 and the Al wire 20. The interposed layer 7 is an insulating layer since it is composed of the Si oxide layer 13 and the Al oxide layer 23. That is, when the Al wire 20 is bonded to the Si electrode 40, the insulating layer is formed between the Si electrode 40 and the Al wire 20 so that a high resistance is generated between the Si electrode 40 and the Al wire 20. Consequently, even when a voltage was applied between the Al wire 20 and the Si electrode 40, a current hardly flew.

However, when a voltage having a specified value or more is applied, the interposed layer 7 has a plurality of portions thereof removed. In several ones of the plurality of portions, Al extends from the Al wire 20 toward the Si electrode 40 to come in contact therewith, as shown in FIG. 3A. In the other portions from which the interposed layer 7 has been removed, the Al wire 20 partly extends toward the Si electrode 40 to form the Al portions 14b and the Si electrode 40 partly extends toward the Al wire 20 to form the Si portions 14a so that the Al portions 14b and the Si portions 14a come in contact with each other, as shown in FIG. 3B. In other words, when a voltage of 2 V or more is applied, the plurality of penetrating portions 6 are formed in the interposed layer 7. In several ones of the plurality of penetrating portions 6, Al from the Al wire 20 is filled to come in contact with the Si electrode 40. In the other penetrating portions 6, Al from the Al wire 20 is injected to form the Al portions 14b and Si from the Si electrode 40 is injected to form the Si portions 14a so that the Si portions 14a and the Al portions 14b come in contact with each other. In either case, it is considered that the application of a voltage having a specified value or more brings the Si electrode 40 and the Al wire 20 into contact with each other, the contact between the Si electrode 40 and the Al wire 20 forms an ohmic contact therebetween, and therefore the I-V characteristic according to the Ohm's law is obtained.

It is considered that the value required of the applied voltage to form the ohmic contact differs depending on the voltage application method and also on bonding conditions when the Al wire 20 is bonded to the Si electrode 40. Accordingly, the value required of the applied voltage cannot be determined unconditionally but the lower-limit value thereof is preferably 1 V, more preferably 2 V. The upper-limit value required of the applied voltage is not particularly limited but it is preferably about 5 V. This is because, even when a voltage having a value higher than 5 V is applied, the value of the electric resistance between the Al wire 20 and the Si electrode 40 cannot conceivably be further reduced.

Figure 7:
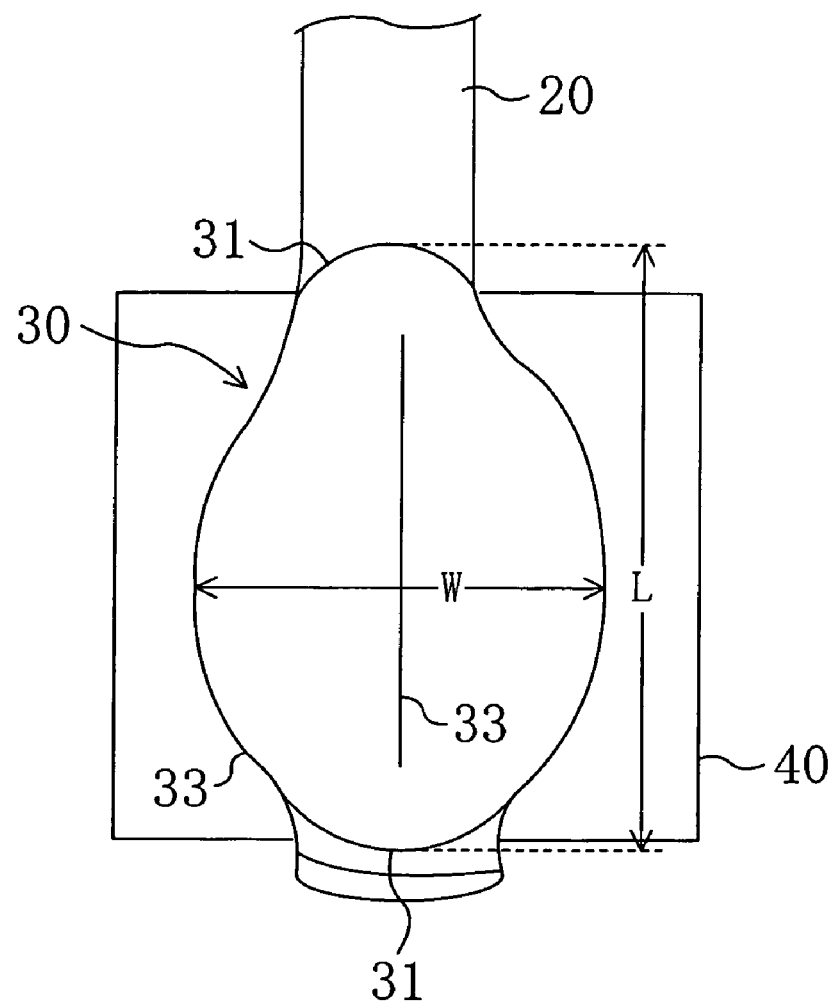
FIG. 7 is a schematic view when a connection portion is viewed from above the Si electrode.

The present inventors electrically connected the Al wire 20 to the Si electrode 40 and then performs SEM observation and EDX analysis. To perform the SEM observation, the Al wire 20 was first detached from the Si electrode 40 and then the surface of the Si electrode 40 from which the Al wire 20 had been detached was etched by using, e.g., a phosphoric acid solution. The SEM observation was performed with respect to the etched surface of the Si electrode 40. FIG. 7 is a schematic view when the connection portion 30 is viewed from above the Si electrode 40. According to the result of the SEM observation, the connection portion 30 of the Si electrode 40 had a generally ellipsoidal outer configuration. In addition, protrusions 33 were observed in dotted relation at the peripheral portion of the connection portion 30 and were also observed in dotted relation inside the connection portion 30 longitudinally thereof. Although the protrusions 33 are protruding from the surface of the Si electrode 40, they are represented as the solid line in FIG. 7. As a result of performing the EDX analysis with respect to the etched surface of the Si electrode 40, Si and O were detected from the protrusions observed in the SEM observation but Al was not detected therefrom. From the result of the EDX analysis, it can be considered that, in each of the protrusions 33, the Si electrode 40 is protruding closer to and in contact with the Al wire 20 than in the first part 2, i.e., that the protrusions 33 are the second parts 14.

It is considered that the protrusions are formed at the portions of the Si electrode 40 on each of which a relatively heavy load was placed. Specifically, the peripheral portion of the Al wire 20 is pressed more tightly against the Si electrode 40 than the inner portion of the Al wire 20. When an ultrasonic wave is applied, the Al wire 20 vibrates in a wire draw direction. As a result, the portion of the Al wire 20 which stretches in the wire draw direction during the application of the ultrasonic wave is pressed more tightly against the Si electrode 40 than the portion of the Al wire 20 which stretches in a direction other than the wire draw direction (e.g., in a radial direction of the wire).

From a combination of the result of examining the I-V characteristic, the result of the SEM observation, and the result of the EDX analysis, it can be considered that the application of the voltage having a specified value or more partially removed the interposed layer 7, brought the Al wire 20 into contact with the Si electrode 40, and thereby electrically connected the Al wire 20 to the Si electrode 40.

The deformation of the Al wire 20 caused by bonding according to the present embodiment will be shown below.

When the Al wire 20 is thus pressed against the Si electrode 40 by using the solderless vibrating member 50, the Al wire 20 is deformed. The deformed portion of the Al wire 20 (hereinafter referred to as "deformed portion") has a width about 2.4 times the width of the undeformed portion of the Al wire 20. The length (the distance between the two boundaries 31 between the deformed portion and the undeformed portion) L of the deformed portion is larger than the length of the electrode so that the deformed portion also exists outside the Si electrode 40. Since the deformed portion also exists extensively outside the Si electrode 40, the Al wire 20 is reliably and securely bonded to the Si electrode 40. The width ratio of the undeformed portion of the Al wire 20 to the deformed portion is preferably not less than 1.5. When the wire width ratio is less than 1.5, the bonding strength between the Al wire 20 and the Si electrode 40 is insufficient and undesirable.

When the Al wire 20 is pressed against the Si electrode 40 by using the solderless vibrating member 50 as described above, Si is diffused from the Si electrode 40 toward the Al wire 20. As a result, the content of Si in the Al wire 20 is higher in the deformed portion than in the undeformed portion of the Al wire 20. In addition, the content of Si in the deformed portion gradually increases with approach toward the Si electrode 40. Likewise, Al is diffused from the Al wire 20 toward the Si electrode 40 so that the content of Al in the Si electrode 40 is higher in the portion thereof in contact with the Al wire 20 than in the portion thereof out of contact with the Al wire 20. This allows an increase in the bonding strength between the Al wire 20 and the Si electrode 40. As a result of the diffusion of Al and Si described above, each of the second parts 4 contains Si, the Al portion 14b of each of the second parts 14 contains Si, and the Si portion 14a thereof contains Al.

Thus, in the connection structure 1 according to the present embodiment, the Al wire 20 can be connected to the Si electrode 40 without the interposition of plating of Au or the like. As a result, the connection structure 1 can be fabricated at low cost. Since it is unnecessary to provide the Al wire 20 or the Si electrode 40 with plating, the connection structure 1 can be fabricated easily for a short period of time.

Figure 8A:
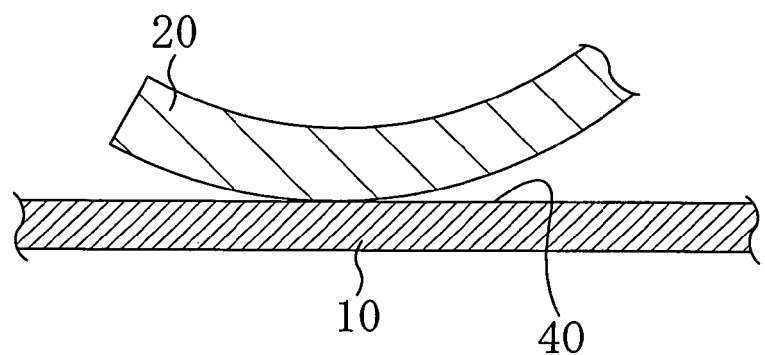
FIGS. 8A and 8B are cross-sectional views each partly illustrating a method for fabricating a connection structure.
Figure 8B:
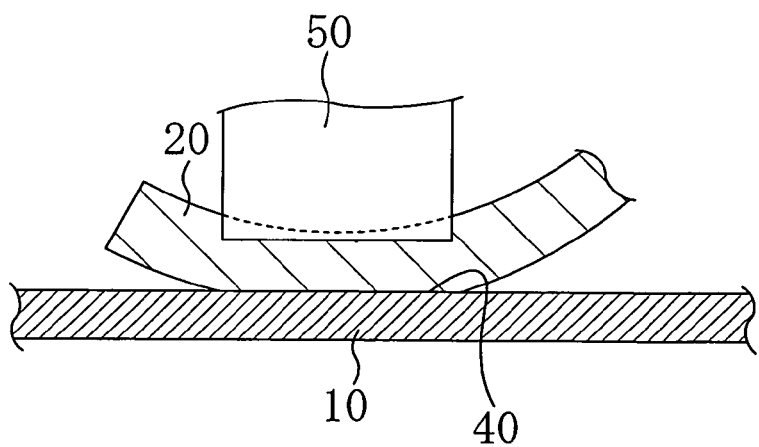

FIGS. 8A and 8B are cross-sectional views each partly illustrating a method for fabricating the connection structure 1 according to the present embodiment. In accordance with the method for fabricating the connection structure 1 according to the present embodiment, the Al wire 20 is bonded to the Si electrode 40 and then a voltage is applied to the Si electrode 40 and to the Al wire 20 bonded thereto.

First, the Si electrode 40 and the Al wire 20 are prepared and the Al wire 20 is brought closer to the Si electrode 40, as shown in FIG. 8A.

Next, under an atmospheric pressure, the Al wire 20 is pressed against the Si electrode 40 by using the solderless vibrating member (e.g., wedge tool) 50 and an ultrasonic wave is applied to the solderless vibrating member 50, as shown in FIG. 8B. When the Al wire 20 is pressed against the Si electrode 40, a natural oxide film (not shown) is formed at the interface between the Al wire 20 and the Si electrode 40. However, the application of the ultrasonic wave causes friction at the interface between the Al wire 20 and the Si electrode 40 so that the natural oxide film formed at the interface is removed therefrom. At the same time, heat is generated at the interface by the friction caused thereat and the generated heat rapidly decreases the tensile strength of the Al wire 20 and causes the plastic deformation thereof. As a result, the Al wire 20 is bonded to the Si electrode 40. Since bonding is performed in an atmosphere in which oxygen is present, an oxide is formed at the interface between the Al wire 20 and the Si electrode 40.

When the Al wire 20 is bonded to the Si electrode 40, the Al wire 20 is preferably pressed against the Si electrode 40 with the application of a load of not less than 0.14 N and not more than 0.4 N and with the application of an ultrasonic wave at a frequency of not less than 60 kHz and not more than 140 kHz for a time period of not less than 30 ms and not more than 50 ms. The magnitude of the load, the frequency of the ultrasonic wave, and the application time of the ultrasonic wave are not limited to the ranges shown above. However, the values under the foregoing ranges are unpreferable because they may cause defective bonding. Conversely, the values over the foregoing ranges are also unpreferable because they may cause the cratering of the Si electrode 40 (the delamination of the Si electrode 40 reaching the layer thereunder) or the irregular configuration of the bonded portion.

Subsequently, a voltage is applied between the Si electrode 40 and the Al wire 20 bonded thereto. By the application of the voltage, the interposed layer 7 formed by bonding is partially removed and the Al wire 20 comes in contact with the Si electrode 40. In this manner, the connection structure 1 can be fabricated.

The value of the applied voltage cannot be determined unconditionally since it differs depending on the bonding conditions, i.e., the magnitude of the load, the frequency of the ultrasonic wave, the application time of the ultrasonic wave, and the like. However, the value of the applied voltage is preferably not less than 1 V and not more than 5 V. The application of a voltage less than 1 V is unpreferable since it cannot provide a sufficient electric connection between the Si electrode 40 and the Al wire 20. The application of a voltage more than 5 V is also unpreferable since it conceivably does not further improve the electric property of the connection structure 1.

Embodiment 2

Figure 9A:
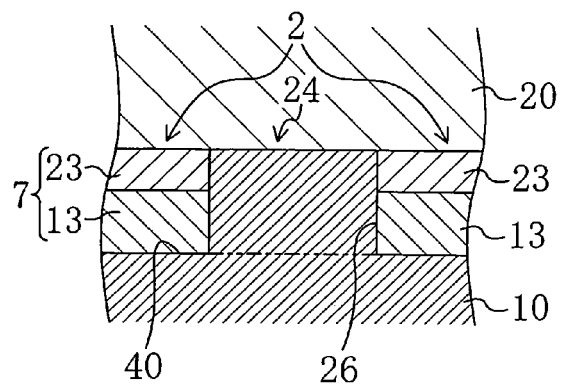
FIG. 9A is an enlarged cross-sectional view showing the structure of a second part of a connection structure according to a second embodiment of the present invention and FIG. 9B is an enlarged cross-sectional view showing the structure of another second part of the connection structure according to the second embodiment.
Figure 9B:
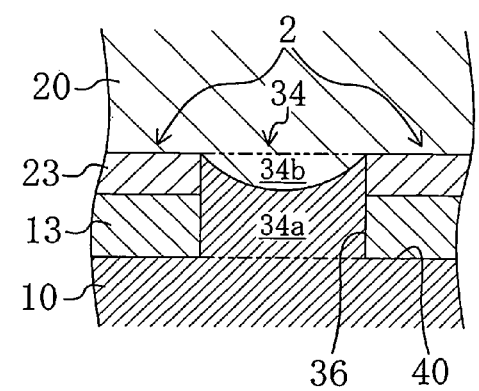

In a connection structure according to the second embodiment of the present invention, the structures of second parts 24 and 34 are different from those of the second parts 4 and 14 according to the first embodiment. FIG. 9A is an enlarged cross-sectional view showing the structure of each of the second parts 24 of the connection structure according to the present embodiment. FIG. 9B is an enlarged cross-sectional view showing the structure of each of the second parts 34 of the connection structure according to the present embodiment.

In each of the second parts 24, Si is present in such a manner that it extends from the Si electrode 40 toward the Al wire 20 and comes in contact therewith, as shown in FIG. 9A. In each of the second parts 34, a Si portion 34a and an Al portion 34b are present in such a manner that the Si portion 34a extends from the Si electrode 40 toward the Al wire 20 and the Al portion 34b extends from the Al wire 20 toward the Si electrode 40 and comes in contact with the Si portion 34a, as shown in FIG. 9B. Thus, in each of the second parts 24 and 34, the Al wire 20 is in direct contact with the Si electrode 40.

In other words, the interposed layer 7 is present between the Si electrode 40 and the Al wire 20 in each of the second parts 24 and 34 and the plurality of penetrating portions 6 are provided in the interposed layer 7. In several ones of the plurality of penetrating portions 6, Si is present in such a manner that it extends from the Si electrode 40 toward the Al wire 20 and comes in contact therewith, as shown in FIG. 9A. In the other penetrating portions 6, the Si portions 34a and the Al portions 34b are present in such a manner that the Si portions 34a extend from the Si electrode 40 toward the Al wire 20 and the Al portions 34b extend from the Al wire 20 toward the Si electrode 40 and come in contact with the Si portions 34a, as shown in FIG. 9B.

The connection structure according to the present embodiment is fabricated in accordance with substantially the same method as used to fabricate the connection structure 1 according to the first embodiment. In the present embodiment, when the voltage having a specified value or more described in the first embodiment is applied between the Si electrode 40 and the Al wire 20 bonded thereto, the interposed layer 7 has a plurality of portions thereof removed. In several ones of the plurality of portions, the Si electrode 40 partly extends toward the Al wire 20 to form the Si portions 34a which come in contact with the Al wire 20, as shown in FIG. 9A. In the other portions from which the interposed layer 7 has been removed, the Al wire 20 partly extends toward the Si electrode 40 to form the Al portions 34b and the Si electrode 40 partly extends toward the Al wire 20 to form the Si portions 34a so that the Si portions 34a and the Al portions 34b come in contact with each other, as shown in FIG. 9B. In other words, when the voltage having a specified value or more described in the first embodiment is applied, the plurality of penetrating portions 6 are formed in the interposed layer 7. In several ones of the penetrating portions 6, Si from the Si electrode 40 is filled to come in contact with the Al wire 20. In the other penetrating portions 6, Al from the Al wire 20 is injected to form the Al portions 34b and Si from the Si electrode 40 is also injected to form the Si portions 34a so that the Si portions 34a and the Al portions 34b come in contact with each other. In either case, the application of the voltage having a specified value or more brings the Si electrode 40 and the Al wire 20 into contact with each other and the contact between the Si electrode 40 and the Al wire 20 forms an ohmic contact therebetween.

Embodiment 3

Figure 10A:
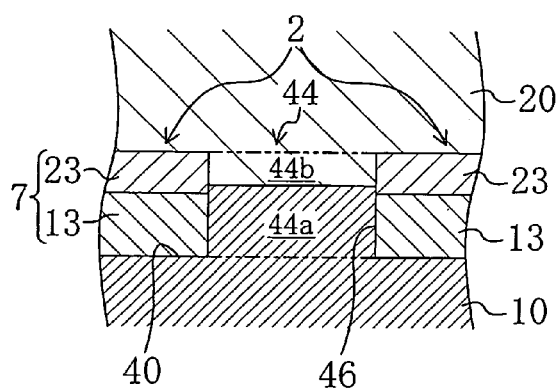
FIG. 10A is an enlarged cross-sectional view showing the structure of a second part of a connection structure according to a third embodiment of the present invention and FIG. 10B is an enlarged cross-sectional view showing the structure of another second part of the connection structure according to the third embodiment.
Figure 10B:
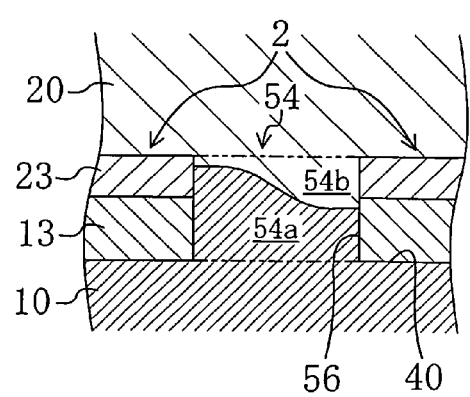

In a connection structure according to the third embodiment of the present invention, the structures of second parts 44 and 54 are different from those of the second parts 4 and 14 according to the first embodiment. FIG. 10A is an enlarged cross-sectional view showing the structure of each of the second parts 44 in the connection structure according to the present embodiment. FIG. 10B is a cross-sectional view showing the structure of each of the second parts 54 in the connection structure according to the present embodiment.

In the second parts 44 and 54, Si portions 44a and 54a and Al portions 44b and 54b are respectively present in mutually contact relation. The Si portions 44a and 54a extend from the Si electrode 40 toward the Al wire 20, while the Al portions 44b and 54b extend from the Al wire 20 toward the Si electrode 40 and come in contact with the Si portions 44a and 54a. As shown in FIG. 10A, the boundary between the Si portion 44a and the Al portion 44b is substantially parallel with the Si electrode 40 in each of the second parts 44, while the boundary between the Si portion 54a and the Al portion 54b is not parallel with the Si electrode 40 in each of the second parts 54.

In either case, the Al portion 44b is in contact with the Si portion 44a and the Al portion 54b is in contact with the Si portion 54a so that the Al wire 20 is in direct contact with the Si electrode 40.

In other words, the interposed layer 7 is present between the Si electrode 40 and the Al wire 20 in each of the second parts 44 and 54 and the plurality of penetrating portions 6 are provided in the interposed layer 7. Each of the plurality of penetrating portions 6 is provided to extend from the Al wire 20 through the interposed layer 7 to reach the Si electrode 40. In several ones of the plurality of penetrating portions 6, the Si portions 44a and the Al portions 44b are present in mutually contact relation. In the other penetrating portions 6, the Si portions 54a and the Al portions 54b are present in mutually contact relation. The boundaries between the Si portions 44a and the Al portions 44b are substantially parallel with the Si electrode 40. The boundaries between the Si portions 54a and the Al portions 54b are not parallel with the Si electrode 40.

The connection structure according to the present embodiment is fabricated in accordance with substantially the same method as used to fabricate the connection structure 1 according to the first embodiment. In the present embodiment, when the voltage having a specified value or more described in the first embodiment is applied between the Si electrode 40 and the Al wire 20, the interposed layer 7 has a plurality of portions thereof removed. In the plurality of portions from which the interposed layer 7 has been removed, the Si electrode 40 partly extends toward the Al wire 20 to form the Si portions 44a and 54a and the Al wire 20 partly extends toward the Si electrode 40 to form the Al portions 44b and 54b so that the Si portions 44a and the Al portions 44b come in contact with each other and the Si portions 54a and the Al portions 54b come in contact with each other, as shown in FIGS. 10A and 10B. In other words, when the voltage having a specified value or more described in the first embodiment is applied, the plurality of penetrating portions 6 are formed in the interposed layer 7. In the individual penetrating portions 6, Al from the Al wire 20 is injected to form the Al portions 44b and 54b and Si from the Si electrode 40 is injected to form the Si portions 44a and 54a so that the Si portions 44a and the Al portions 44b come in contact with each other and the Si portions 54a and the Al portions 54b come in contact with each other. As a result, an ohmic contact is formed between the Si electrode 40 and the Al wire 20.

Embodiment 4

Figure 11:
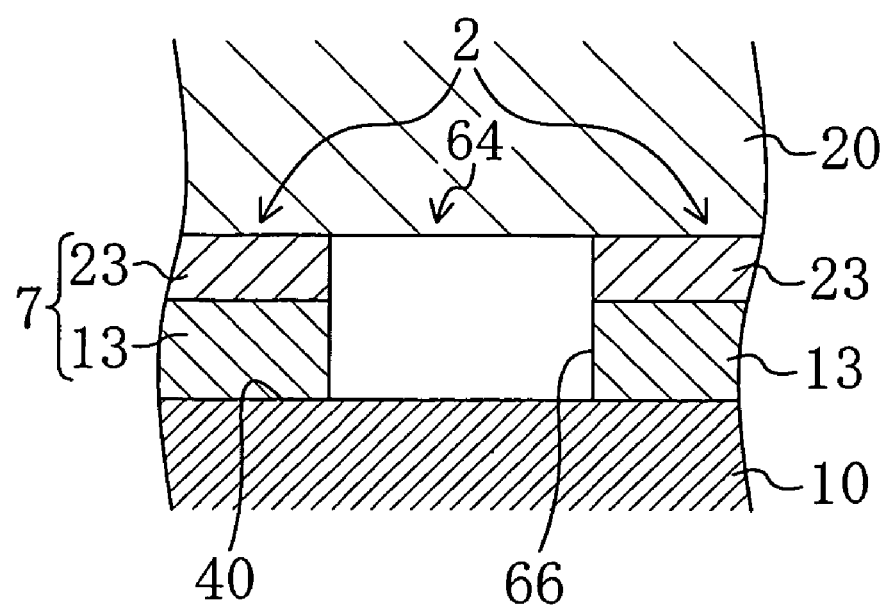
FIG. 11 is an enlarged cross-sectional view showing the structure of a second part of a connection structure according to a fourth embodiment of the present invention.

In a connection structure according to the fourth embodiment of the present invention, the structure of each of second parts 64 is different from the structures of the second parts 4 and 14 according tQ the first embodiment. FIG. 11 is an enlarged cross-sectional view showing the structure of each of the second parts 64 of the connection structure according to the present embodiment.

In each of the plurality of second parts 64, Si and Al are present in mixed relation. Si is in contact with Al in the second part 64 and also with the Al wire 20. Al is in contact with Si in the second part 64 and also with the Si electrode 40.

In other words, the interposed layer 7 is present between the Si electrode 40 and the Al wire 20 in each of the second parts 64 and the plurality of penetrating portions 6 are provided in the interposed layer 7. Each of the penetrating portions 6 is provided to extend from the Al wire 20 through the interposed layer 7 to reach the Si electrode 40 and Si and Al are present in mixed relation in each of the penetrating portions 6.

The connection structure according to the present embodiment is fabricated in accordance with substantially the same method as used to fabricate the connection structure 1 according to the first embodiment. In the present embodiment, when the voltage having a specified value or more described in the first embodiment is applied between the Si electrode 40 and the Al wire 20, the interposed layer 7 has a plurality of portions thereof removed. In the plurality of portions from which the interposed layer 7 has been removed, Si is extracted from the Si electrode 40 and Al is extracted from the Al wire 20 so that the Si and Al come in contact with each other. In other words, when the voltage having a specified value or more described in the first embodiment is applied, the plurality of penetrating portions 6 are formed in the interposed layer 7 and, in each of the penetrating portions 6, Al from the Al wire 20 and Si from the Si electrode 40 are filled. Thus, the application of the voltage having the specified value or more brings the Si electrode 40 and the Al wire 20 into contact with each other via the second parts 64 and the contact between the Si electrode 40 and the Al wire 20 forms an ohmic contact therebetween.

Embodiment 5

The fifth embodiment of the present invention will show a method for fabricating a chip size package (CSP) comprising the connection structure according to any of the first to fourth embodiments by using a Si electrode as an example of the Si member and using an Al bump as an example of the Al member.

FIGS. 12A to 12D are cross-sectional views illustrating the process steps of fabricating the CSP according to the present embodiment. The CSP according to the present embodiment is fabricated in accordance with the following method.

Figure 12A:
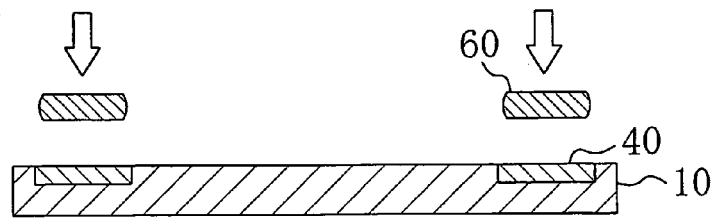
FIGS. 12A to 12D are cross-sectional views showing the process steps of fabricating a CSP according to a fifth embodiment of the present invention.

First, as shown in FIG. 12A, Al bumps 60 are formed on the respective Si electrode 40 of a Si substrate (semiconductor chip) 10 formed with a semiconductor circuit. Each of the Al bumps 60 has a size sufficient to cover substantially the entire surface of each of the Si electrodes 40. On the Si substrate 10, the plurality of Si electrodes 40 are present and the Al bumps 60 are placed on all of the Si electrodes 40.

Figure 12B:

Next, as shown in FIG. 12B, the Al bumps 60 are pressed against the Si electrodes 40 by using a solderless vibrating member not shown. The bonding conditions used at this time are the same as those used in the first embodiment. In the present embodiment, the Al bumps 60 are individually bonded to all the Si electrodes 40 formed on the single Si substrate 10 on a one-by-one basis. By thus providing bonding, the Al oxide layers 23 and the Si oxide layers 13 expand between the Al bumps 60 and the Si electrodes 40 in the same manner as in each of the first to fourth embodiments. As a result, mechanically and electrically reliable and secure connections are provided between the Al bumps 60 and the Si electrodes 40 at low cost. The respective thicknesses of the layer made of an Al oxide and the layer made of a Si oxide are the same as in the first embodiment. Subsequently, electrical connections are provided between the Si electrodes 40 and the Al bumps bonded thereto by applying the voltage having a specified value or more described in the first embodiment between the Si electrodes 40 and the Al bumps, though they are not depicted.

Figure 12C:
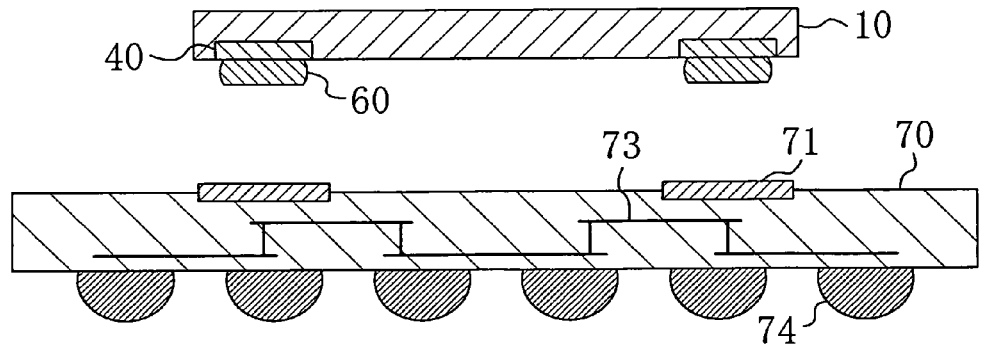

Subsequently, as shown in FIG. 12C, the Si substrate 10 is aligned to face a package substrate 70. At this time, the Si substrate 10 is aligned and positioned such that the Al bumps 60 and substrate electrodes 71 on the package substrate 70 are opposed to each other. On the surface of the package substrate 70 opposite to the surface thereof formed with the substrate electrodes 71, solder balls 74 are formed. In the package substrate 70, internal wirings for providing electrical connections between the substrate electrodes 71 and the solder balls 74 are formed.

Figure 12D:
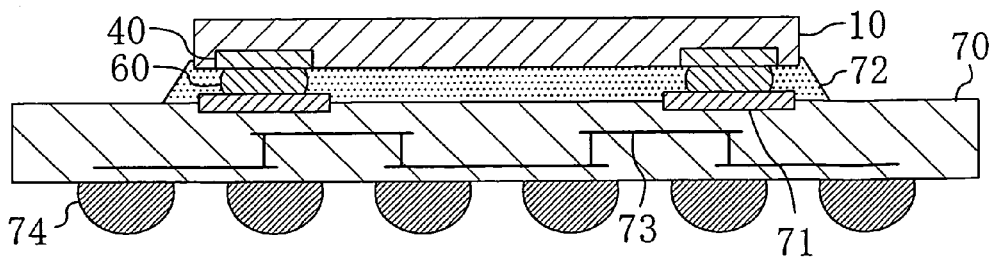

Then, as shown in FIG. 12D, the Al bumps 60 of the Si substrate 10 and the substrate electrodes 71 of the package substrate 70 are brought into contact with and connected to each other and the connection portions are protected by injecting an underfill resin 72 in the space between the Si substrate 10 and the package substrate 70 and curing it. In this manner, the CSP is completed. Resin encapsulation may also be provided more extensively to cover a wider range. In the present embodiment, resin encapsulation is performed by a so-called "capillary flow" process. However, it is also possible to adopt a "compression flow" process which preliminarily applies a mold resin and brings the Al bumps 60 of the Si substrate 10 into contact with the substrate electrodes 71 of the package substrate 70, thereby providing connections therebetween.

According to the present embodiment, the Al bumps 60 can be bonded to the Si electrodes 40 of the Si substrate 10 by an easy and short-time step. The bonding provides mechanically and electrically reliable and secure connections between the Al bumps 60 and the Si electrodes 40 and thereby allows low-cost connection to be performed.

Other Embodiments

In each of the first to fifth embodiments described above, the following structure may also be adopted.

A device to which the technology according to the present invention is applied may be not only a semiconductor integrated circuit or a MEMS device but also an optical device such as an image sensor or a laser element.

A substrate on which Si electrodes are provided is not limited to a Si substrate. It is also possible to use a SiGe (Silicon Germanium) substrate, a SiGeC (Silicon Germanium Carbon) substrate, a GaAs (Gallium Arsenide) substrate, or the like.

In each of the first to fourth embodiments described above, the following structure may also be adopted.

Although the first to fourth embodiments have shown the respective structures of the second parts, it is also possible for one connection structure to have all of the structures of the second parts described in these embodiments. Specifically, the connection structure has the plurality of second parts of which several ones may have Al therein, other several ones may have Si therein, still other several ones may have Al portions and Si portions therein, and the others may have Si and Al in mixed relation. Alternatively, one connection structure may also have the respective structures of the second parts described in any arbitrary two or three of the embodiments. It is considered that the structures of the second parts are dependent on bonding conditions when the Al wires are bonded to the Si electrodes, on a voltage application method, and on the value of an applied voltage.

The configuration and size of each of the second parts are not limited to the configuration and size shown in FIG. 2. It is considered that the configuration and size of the second part are also dependent on the bonding conditions, the voltage application method, and the value of the applied voltage. The size of each of the second parts is preferably larger than the ionic radius of Al and the grain size of polycrystalline Si and preferably not less than 40 nm and not more than 800 nm.

The second parts may be distributed in dotted relation only at the peripheral portion of the connection portion or may be distributed in dotted relation inside the connection portion only longitudinally thereof. Alternatively, the second parts may also be present in the area of the connection portion other than at the peripheral portion or in the longitudinal direction thereof.

Alternatively, the second parts may be present at the entire peripheral portion of the connection portion or extensively in the longitudinal direction thereof. Specifically, the plurality of second parts may be present at the peripheral portion or longitudinally of the connection portion without being connected to each other. The second parts may also be present indiscretely at the peripheral portion of the connection portion or extensively in the longitudinal direction thereof.

Although the Al wire and the Al bump have been used as examples of the Al member, the Al member is not limited thereto. The Al member need not contain Si and may contain another element other than Si. Although the Si electrode has been used as an example of the Si member, it is not limited thereto. The Si member may also contain another element.

In the fifth embodiment, the following structure may also be adopted.

The method for bonding the Al bumps onto the Si substrate may be a method which bonds the Al bumps on a one-by-one basis, such as used in the step shown in FIG. 12B for single-point bonding, or may also be a method which simultaneously bonds all the Al bumps.

What is claimed is:

1. A connection structure between a Si member made of Si and an Al member made of Al, the connection structure comprising:
a first part and a second part each interposed between the Si member and the Al member in contact relation with each of the Si member and the Al member, wherein
a Si oxide layer and an Al oxide layer are present in the first part such that the Si oxide layer is in contact with the Si member and the Al oxide layer is interposed between the Si oxide layer and the Al member and
at least one of Si and Al is present in the second part, wherein:
the Si member is a Si electrode,
the Al member is an Al wire,
each of the first and second parts is present in a connection portion in which the Al wire is connected to a surface of the Si electrode, and
the second parts are present in dotted relation at the surface of the Si electrode and at a peripheral portion of the connection portion.

2. The connection structure of claim 1, wherein
a portion of the Al wire which is in contact with the first part and the second part is deformed and
the deformed portion of the Al wire has a width which is 1.5 times or more a width of a portion of the Al wire which is not deformed.

3. A connection structure between a Si member made of Si and an Al member made of Al, the connection structure comprising:
a first part and a second part each interposed between the Si member and the Al member in contact relation with each of the Si member and the Al member, wherein
a Si oxide layer and an Al oxide layer are present in the first part such that the Si oxide layer is in contact with the Si member and the Al oxide layer is interposed between the Si oxide layer and the Al member and
at least one of Si and Al is present in the second part, wherein:
the Si member is a Si electrode,
the Al member is an Al wire containing Si;
each of the first and second parts is present in a connection portion in which the Al wire is connected to the Si electrode,
the connection portion has a generally ellipsoidal outer configuration at the surface of the Si electrode, and
the second parts are present in dotted relation inside the connection portion longitudinally thereof.

4. A connection structure between a Si member made of Si and an Al member made of Al, the connection structure comprising:
an interposed layer composed of a Si oxide layer and an Al oxide layer between the Si member and the Al member such that the Si member, the Si oxide layer, the Al oxide layer, and the Al member are stacked in this order, wherein
the interposed layer has a penetrating portion which extends from the Al member through the interposed layer to reach the Si member and
the penetrating portion is made of at least one of Al and Si, wherein:
the Si member is a Si electrode,
the Al member is an Al wire containing Si,
the interposed layer is present in a connection portion in which the Al wire is connected to a surface of the Si electrode, and
the penetrating portions are present in dotted relation at the surface of the Si electrode and at a peripheral portion of the connection portion.

5. The connection structure of claim 4, wherein
a portion of the Al wire which is in contact with the interposed layer is deformed and
the deformed portion of the Al wire has a width which is 1.5 times or more a width of a portion of the Al wire which is not deformed.

6. A connection structure between a Si member made of Si and an Al member made of Al, the connection structure comprising:
an interposed layer composed of a Si oxide layer and an Al oxide layer between the Si member and the Al member such that the Si member, the Si oxide layer, the Al oxide layer, and the Al member are stacked in this order, wherein
the interposed layer has a penetrating portion which extends from the Al member through the interposed layer to reach the Si member and
the penetrating portion is made of at least one of Al and Si, wherein:
the Si member is a Si electrode,
the Al member is an Al wire containing Si,
the interposed layer is present in a connection portion in which the Al wire is connected to a surface of the Si electrode,
the connection portion has a generally ellipsoidal configuration at the surface of the Si electrode, and
the penetrating portions are present in dotted relation inside the connection portion longitudinally thereof.

* * * * *